(12) United States Patent
Park et al.

(10) Patent No.: US 7,167,002 B2
(45) Date of Patent: Jan. 23, 2007

(54) STABILIZER FOR STABILIZING NMR MAGNETIC FIELD AND METHOD OF THE SAME

(75) Inventors: Minseok Park, Hitachinaka (JP); Hideta Habara, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/187,856

(22) Filed: Jul. 25, 2005

(65) Prior Publication Data

US 2006/0017441 A1  Jan. 26, 2006

(30) Foreign Application Priority Data

Jul. 26, 2004  (JP) .............................. 2004-217424

(51) Int. Cl.
*G01V 3/00* (2006.01)
(52) U.S. Cl. ...................................... 324/318; 324/319
(58) Field of Classification Search ................ 324/318, 324/320, 319, 322, 307, 309, 300; 600/410
See application file for complete search history.

(56) References Cited

U.S. PATENT DOCUMENTS

| | | | |
|---|---|---|---|
| 3,388,322 A | | 6/1968 | Anderson |
| 4,122,386 A | * | 10/1978 | Tomita et al. ............... 324/320 |
| 4,761,614 A | * | 8/1988 | Prammer et al. ............ 324/320 |
| 5,391,990 A | * | 2/1995 | Schmitt et al. .............. 324/320 |
| 5,432,826 A | * | 7/1995 | Rieder ......................... 375/371 |
| 5,442,290 A | * | 8/1995 | Crooks ........................ 324/309 |
| 6,037,775 A | * | 3/2000 | Shenoy et al. ............... 324/320 |
| 6,825,667 B1 | * | 11/2004 | Tsuda .......................... 324/320 |
| 2002/0003422 A1 | | 1/2002 | Nauerth |
| 2004/0264751 A1 | * | 12/2004 | Avinash ....................... 382/128 |
| 2005/0248348 A1 | * | 11/2005 | Axel ............................ 324/320 |

FOREIGN PATENT DOCUMENTS

DE           2 015 137         10/1971

(Continued)

OTHER PUBLICATIONS

Gerhard Wider, "Technical Aspects of NMR Spectroscopy with Biological Macromolecules and Studies of Hydration in Solution". Progress in Nuclear Magnetic Resonance Spectroscopy, vol. 32, p. 225, 1998.

(Continued)

*Primary Examiner*—Brij B. Shrivastav
(74) *Attorney, Agent, or Firm*—Antonelli, Terry, Stout and Kraus, LLP.

(57) ABSTRACT

An NMR apparatus provided with a lock device having improved monotonicity without reducing a control range. In a lock device including a lock transmitter, a lock receiver, a lock detector, a lock corrector, a lock power supply and a lock coil, the lock detector performs complex detection of a detection signal and outputs to the lock corrector an absorption signal SA which is a real number component of the detection signal and a dispersion signal SD which is an imaginary number component of the detection signal; the lock corrector obtains a value SC by multiplying together $SD/(SD^2+SA^2)$ and a value G, and the lock power supply performs adjustment so that a current flowing through the lock coil is proportional to SC. Different constants G are selectively used according to the value of $SD/(SD^2+SA^2)$.

8 Claims, 6 Drawing Sheets

| | FOREIGN PATENT DOCUMENTS | |
|----|----|----|
| FR | 1 588 870 | 3/1970 |
| JP | 63-111450 | 5/1988 |
| JP | 3-176683 | 7/1991 |
| JP | 2504666 | 4/1996 |

OTHER PUBLICATIONS

Benedict W. Bangerter, "Field/Frequency Lock Monitor for Signal Averaging with High Resolution NMR Spectrometers", Review of Scientific Instruments, vol. 46, p. 617, 1975.

* cited by examiner

STABILIZER FOR STABILIZING NMR MAGNETIC FIELD AND METHOD OF THE SAME

BACKGROUND OF THE INVENTION

The present invention relates to a magnetic field stabilizer in a nuclear magnetic resonance spectrograph (hereinafter referred to as "NMR spectrograph") and a method of stabilizing an NMR magnetic field with the stabilizer.

NMR spectrographs are being used to measure various specimens including organic materials, solid materials and biological macromolecules. As described in a non-patent document 1 (Gerhard Wider, Technical aspect of NMR spectroscopy with biological macromolecules and studies of hydration in solution, Progress in Nuclear Magnetic Resonance Spectroscopy, vol. 32, p 225, 1998"), an apparatus of this kind measures a resonance frequency of a specimen placed in a static magnetic field and it is required that this static magnetic field be stable and have a rate of change of 1 ppb/hr or less with respect to time. To produce a stable static magnetic field, most of the existing NMR spectrographs are equipped with a superconducting magnet. Even in a superconducting magnet, however, it is virtually impossible to achieve a stability of 1 ppb/hr. A lock device for stabilizing a static magnetic field by feedback control is important in enabling NMR spectrographs to deliver the desired performance. With the development of studies on proteins requiring long-time measurement processes, the importance of such a lock device is increasing.

A non-patent document 2 (Benedict W. Bangerter, Field/frequency lock monitor for signal averaging with high resolution NMR sepectrometers, Review of Scientific Instruments, vol. 46, p 617, 1975) discloses a technique used for the lock device. An alternating-current magnetic field having a radio frequency is radiated from a lock transmitter to a specimen placed in a magnet for use in an NMR apparatus to excite a magnetization vector in the specimen. The motion of the excited magnetization vector is received through an antenna for detection and is detected by using a receiving circuit. A component called a dispersion signal (SD) is obtained by adjusting the phase of a reference signal used at the time of detection.

The dispersion signal SD is multiplied by a predetermined proportion constant G and the result of this multiplication is delivered to a lock power supply. The lock power supply causes a current proportional to G×SD (correction signal SC) to flow through a coil provided around the specimen (hereinafter referred to as "lock coil") to form a correction magnetic field proportional to the correction signal SC around the specimen. The proportion constant G is determined so that the dispersion SD obtained after adding the correction magnetic field is close to zero, thereby stabilizing the static magnetic field.

As described above, the technique disclosed in non-patent document 2 is characterized by stabilizing the static magnetic field by controlling the current flowing through the lock coil, and the lock corrector can be easily implemented, for example, by using only an analog circuit. The above-described lock detector is also capable of obtaining an absorption signal SA having a 90° phase difference from the dispersion signal SD, but this signal is not used for computation of the correction signal SC. FIG. 5 shows an example of the ideal dispersion signal SD and the absorption signal SA. A detailed description of the dispersion signal SD and the absorption signal SA will be made below.

A patent document 1 (JP-B-2504666) discloses a technique for the lock device, which differs from that disclosed in non-patent document 2 in that the absorption signal SA is used together with the dispersion signal SD to compute the correction signal SC output from the lock corrector. The correction signal SC in patent document 1 is a weighted combination of SD/SA and (1/SA)(dSD/dt).

According to patent document 1, SD/SA is perfectly proportional to a frequency offset $DF=\omega-\omega_0$ due to a disturbance in the static magnetic field when the frequency of the disturbance is low, and the proportion constant is $1/T_2$. $T_2$ is a time period relating to the rate of attenuation of the detection signal VD and called a lateral relaxation time. According to patent document 1, $T_2$ can also be obtained in the control loop and $DF=(1/T_2)(SD/SA)$ can therefore be computed and used as the correction signal SC in the lock control section.

According to patent document 1, the frequency offset DF is also equal to $(1/T_2)\times(SD/SA)+(1/SA)\times(dSD/dt)$. This equation is accurate and has the advantage of being unrelated to any condition and the advantage of including a noise component. Therefore, the technique disclosed in patent document 1 is suitable for use in a case where the disturbance amplitude is comparatively large.

The technique disclosed in patent document 1 has an advantage over the technique disclosed in non-patent document 2 in that the magnetic field can be returned to a stable value by a smaller number of control loops in comparison with the technique because of the proportional relationship between the frequency offset DF and the correction signal SC and good monotonicity.

The technique disclosed in non-patent document 2 still has a problem in terms of monotonicity of the correction signal. As is apparent from the graph of FIG. 5 showing the dispersion signal SD, the dispersion signal SD is divided into three regions having boundaries corresponding to the maximum and minimum values of the dispersion signal SD, and the sign of the change rate dSC/dDF is reversed between adjacent two of the regions. Accordingly, a plurality of frequency offsets DF are associated with one dispersion signal SD. Since the correction signal SC in non-patent document 2 is G×SD, the correction signal apparently lacks monotonicity. Therefore, it is difficult to obtain the desired constant G and a number of control loops are required to return the static magnetic field to a stable value, resulting in a reduction in control speed.

The technique disclosed in patent document 1 increases the control speed by solving the monotonicity problem with the technique disclosed in non-patent document 2. However, since division by the absorption signal SA is introduced, there is a possibility of the correction signal SC becoming unstable when the frequency offset is increased and when the absorption signal becomes smaller. This is because when the magnitude of the absorption signal SA becomes approximately equal to the magnitude of noise, the sign of the correction signal SC can be reversed by the influence of noise. Also, the extent of variation appeared in the correction signal SC due to an error a in receiving phase is larger than that in the case of the technique disclosed in non-patent document 2. Accordingly, the range of frequency offset DF controllable by using the technique disclosed in non-patent document 1 is narrower than that in the case of the technique disclosed in non-patent document 2. The technique disclosed in patent document 1 is advantageous in terms of monotonicity but has a problem that noise and instability with respect to an error in receiving phase are increased and a problem that the controllable range is reduced.

It is an object of the present invention to provide a high-performance NMR apparatus by implementing a lock device having improved monotonicity without reducing the control range.

SUMMARY OF THE INVENTION

The present invention provides, as a means for achieving the object of the present invention, a lock device for an NMR apparatus constituted by a lock transmitter, a lock receiver, a lock detector, a lock corrector, a lock power supply and a lock coil, wherein the lock detector performs complex detection of a detection signal, and outputs to the lock corrector an absorption signal SA which is a real number component of the detection signal and a dispersion signal SD which is an imaginary number component of the detection signal; the lock corrector obtains a value SC by multiplying together $SD/(SD^2+SA^2)$ and a predetermined constant G; and the lock power supply performs adjustment so that a current flowing through the lock coil is proportional to SC.

A lock device having improved monotonicity without reducing the control range is thereby implemented to enable provision of a high-performance NMR apparatus.

Other objects, features and advantages of the invention will become apparent from the following description of the embodiments of the invention taken in conjunction with the accompanying drawings.

DESCRIPTION OF THE INVENTION (EMBODIMENT 1)

Figure 1:
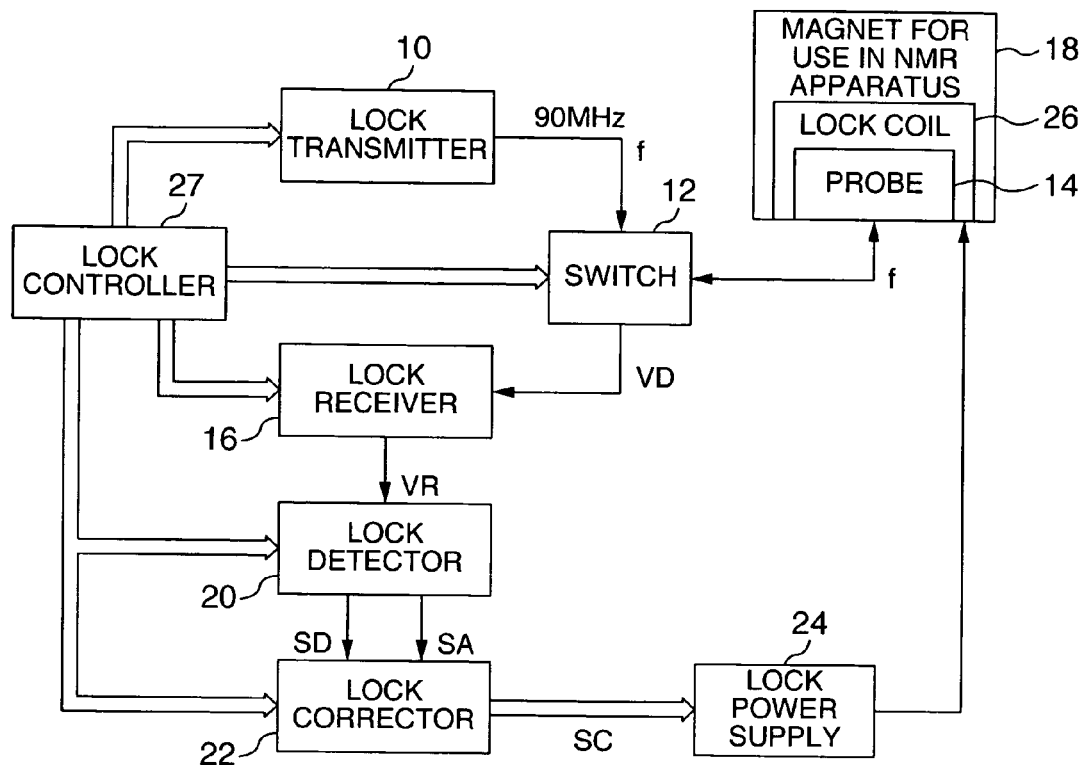
FIG. 1 is a block diagram showing the entire configuration of a lock device in an embodiment of the present invention.

FIG. 1 is a block diagram showing an embodiment of a lock device in accordance with the present invention. A lock transmitter 10 transmits an alternating current having a frequency f to a switch 12. The frequency f is, for example, 92 MHz. The switch 12 is an active or passive electric circuit having the function of connecting/shutting off two circuits: a circuit for connection for transmission from the lock transmitter 10 to a probe 14 and a circuit for connection for transmission from the probe 14 to the lock receiver 16.

When the lock transmitter 10 is operating, the current flows through the circuit for transmission from the lock transmitter 10 to the probe 14. The probe 14 is inserted in a magnet 18 for use in an NMR apparatus. A specimen (not shown) on which a measurement is performed is placed inside the magnet 18. The alternating-current signal that has entered the probe 14 via the switch 12 produces an alternating-current magnetic field having the frequency f through a radiation antenna (not shown) provided in the probe 14. The magnetic field is radiated to the specimen placed in the probe 14.

The frequency f is a resonance frequency which a predetermined reference atomic nucleus carries at a target static magnetic field intensity. As the reference atomic nucleus, heavy hydrogen is ordinarily used. In some case, an atomic nucleus of, for example, fluorine other than heavy hydrogen is used. The spin of the reference atomic nucleus in the specimen is excited by the alternating-current magnetic field to produce a motion. The microscopic spin motion appears as the motion of a macroscopic magnetization vector and induces a voltage of the frequency f (hereinafter referred to as "detection signal VD") in a detection antenna provided in the probe 14.

The radiation antenna may also be used as the detection antenna. The detection signal VD is sent to the lock receiver from the detection antenna via the switch 12. The lock receiver 16 performs one or both of frequency conversion and amplitude conversion on the detection signal VD and transmits the converted signal (hereinafter referred to as the reception signal VR) to a lock detector 20.

The lock detector 20 performs complex detection by multiplying the reception signal VR by a reference signal VF (hereinafter referred to as VF) having a predetermined frequency, phase and amplitude, thereby forms two signals called a dispersion signal SD and an absorption signal (SA) and delivers these signals to a lock corrector 22.

The lock corrector 22 multiplies $SD^2/(SD^2+SA^2)$ by a predetermined constant G to obtain a value as a correction signal SC and delivers the correction signal SC to the lock power supply 24. The lock power supply 24 causes a current proportional to the correction signal SC to flow through a lock coil 26 provided around the specimen, thereby applying a correction magnetic field proportional to the correction signal SC around the specimen. Accordingly, the magnitude of the current flowing through the lock coil 26 is adjusted as a function of the dispersion signal SD and the absorption signal SA. The operations of the lock transmitter 10, the switch 12, the lock receiver 16, the lock detector 20 and the lock corrector 22 are controlled by a lock controller 27.

Figure 2:
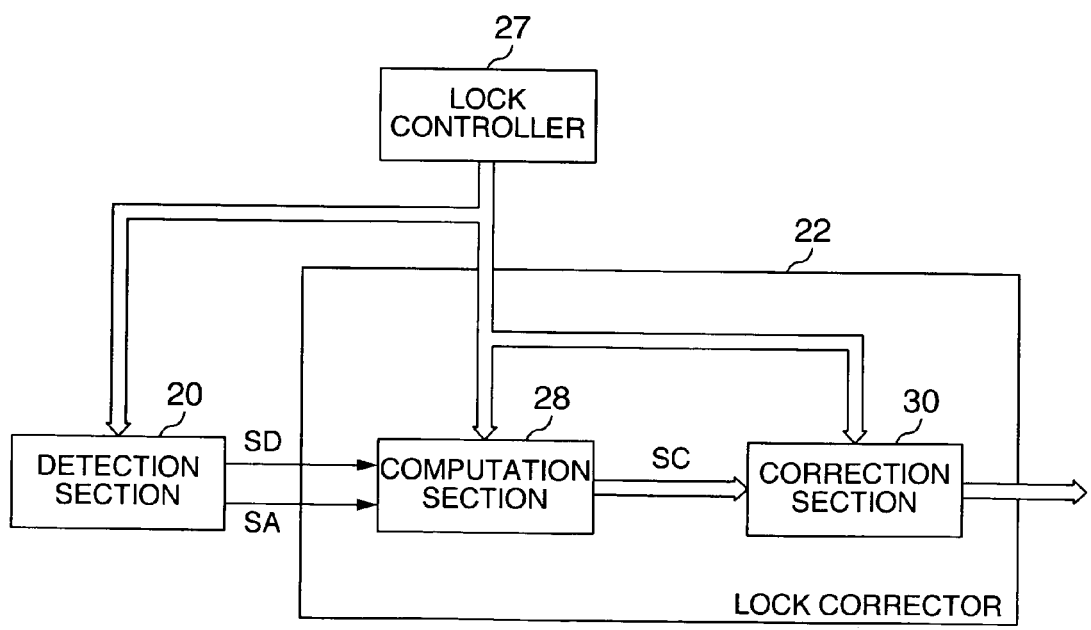
FIG. 2 is a block diagram showing the configuration of a lock corrector.

FIG. 2 is a block diagram showing a concrete configuration of the lock corrector 22. The lock corrector 22 is constituted by a computation section 28 in which the correction signal SC is obtained by using the dispersion signal SD and the absorption signal SA supplied from the lock detector 20, and a correction section 30 from which the correction signal SC obtained in the computation section 28 is output to the lock power supply 24.

Figure 3:
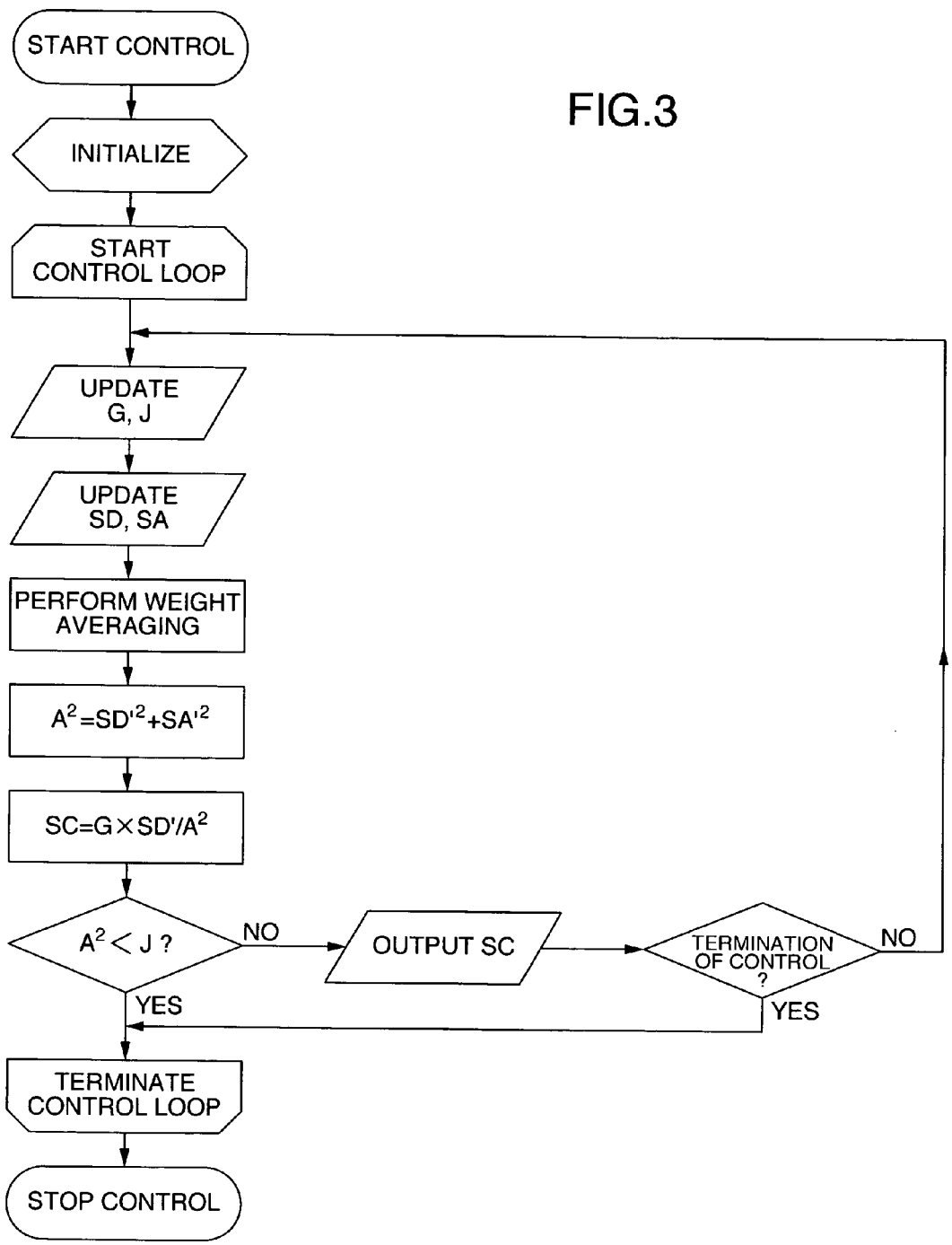
FIG. 3 is a flowchart showing the operation of the lock corrector.

FIG. 3 is a flowchart showing the operation of the computation section 28. The operation shown in FIG. 3 is started when the computation section 28 receives a control start instruction from the lock controller 27. When control is started, a register in the computation section 28 is initialized and a control loop is started. Subsequently, a loop gain G and a control range discrimination threshold value J are updated on the basis of a value supplied from the lock controller 27. Default values for the loop gain G and the control range discrimination threshold value J are set at the time of register initialization. If there is no input supplied from the lock controller 27, the initial values remain as they are.

Subsequently, the dispersion signal SD and the absorption signal SA are updated to values supplied from the lock detector 20, and weight averaging is performed by using the updated dispersion signal SD and absorption signal SA. The order of weight averaging and weight coefficients are set by a user through the lock controller 27. The order may be set to 1 to make weight averaging ineffective. If the S/N of the lock signal is high, weight averaging may be made ineffective to improve the response of the lock device.

When a weight-averaged dispersion signal SD' and a weight-averaged absorption signal SA' are obtained, $A^2=SD'^2+SA'^2$ and $SC=G \times SD'/A^2$ are successively obtained. $A^2$ is compared with the control range discrimination threshold value J. If $A^2$ is smaller than the control range discrimination threshold value J, it is determined that a variation is out of the control range, and transition to control loop termination processing is made. If $A^2$ is equal to or larger than the control range discrimination threshold value J, the correction signal SC is output to the lock power supply 24 through the corrector 30. Comparison between $A^2$ and J may be made immediately after obtaining $A^2$.

Subsequently, a check is made as to whether or not a control termination instruction has been provided from the lock controller 27. The control termination instruction issued during control is stored by using, for example, a queue memory so as not to be lost during control and is executed after output of the correction signal SC. If the control termination instruction has not been provided, the process returns to the initial point in the control loop to repeat the control loop. If the control termination instruction has been provided, transition to loop termination processing is made and control is terminated when the termination processing is completed.

Figure 4:
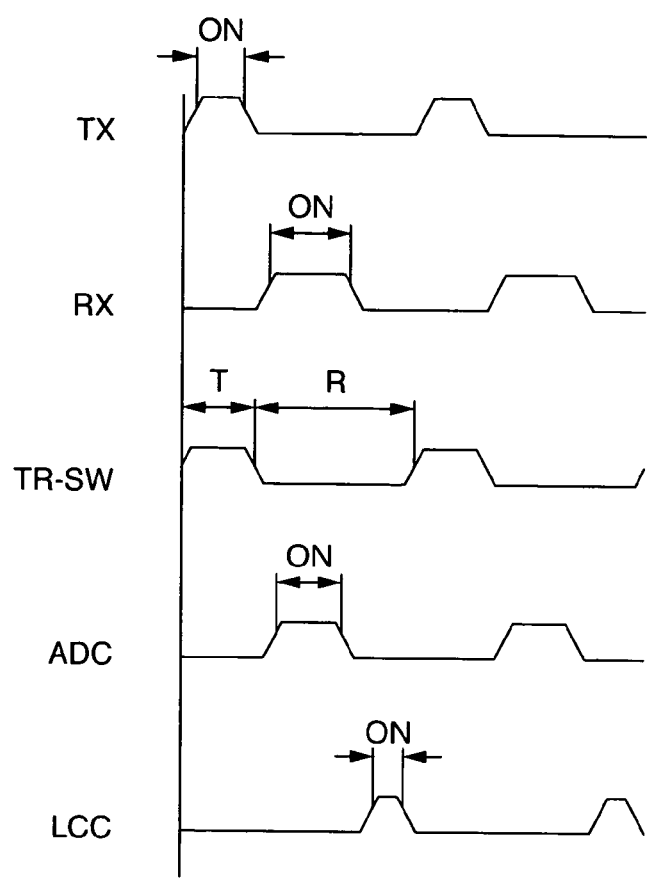
FIG. 4 is a timing chart showing the operation of the lock device.

FIG. 4 is a timing chart used for implementation of the present invention. Transmission (TX) of the alternating current signal from the lock transmitter 10, receiving operation (RX) of the lock receiver 16, transmission/reception change (TR-SW) by the switch 12, operation (ADC) of an analog-digital converter which belongs to the lock detector 20 and timing (LCC) of operation of the lock power supply 24 are shown in this order from the top.

The abscissa of FIG. 4 represents time and the ordinate of FIG. 4 represents the voltage of a trigger signal used to designate timing of each operation. Each of the abscissa and the ordinate is of an arbitrary scale. In FIG. 4, LCC is performed at intervals of a TX-RX period. However, a timing setting can may be easily selected such that LCC is performed one time in several TX-RX periods.

A method of computing the correction signal SC in the present invention will be described. The atomic nucleus spin of the specimen placed in the magnetic field filed is oriented to form a macroscopic magnetization vector M. It is well known that, under a static magnetic field $(0, 0, B_0)$ applied in the z-axis direction and a high-frequency magnetic field $(2B_1 \cos(ft), 0, 0)$ applied in the x-axis direction, the magnetization vector $M=(Mx, My, Mz)$ exhibits a motion expressed by equations shown below.

[Expression 1]

$$\frac{dM_x}{dt} = -M_x \omega_1 \sin(\omega t) - M_y \omega_1 \cos(\omega t) - \frac{M_z - M_0}{T_1} \quad (1)$$

$$\frac{dM_x}{dt} = M_y \omega_0 + M_x \omega_1 \sin(\omega t) - \frac{M_x}{T_2}$$

$$\frac{dM_y}{dt} = M_z \omega_1 \cos(\omega t) - M_x \omega_0 - \frac{M_y}{T_2}$$

$$\omega = 2\pi f, \quad \omega_0 = \gamma \times B_0, \quad \omega_1 = \gamma \times B_1$$

In equations (1), $\gamma$ is an intrinsic physical property value of the reference atomic nucleus called a gyromagnetic ratio; $T_2$ is the above-mentioned lateral relaxation time; and $T_1$ is the longitudinal relaxation time relating to the rate of attenuation of the detection signal VD like $T_2$. Magnetic field intensities $B_0$ and $B_1$ are expressed by $\omega_0$ and $\omega_1$ as shown in equation (1) at the final line because they appear together with the gyromagnetic ratio $\gamma$ at all times.

It is well known from an electromagnetic law that the detection signal VD induced in the detection coil by the motion of the magnetization vector M is $VD=-C \times dMx/dt$ when the detection coil is placed on the x-axis. C is a proportion constant determined by the characteristics of the detection coil, the positional relationship between the detection coil and the specimen and other factors. If equations (1) can be solved, the detection signal VD can be obtained by time differentiation of the Mx solution.

Since the object of the present invention is to provide a lock device used to stabilize the static magnetic field intensity $B_0$, it is desirable that equations (1) be solved under a condition in which $\omega_0$ changes randomly with time. However, it is impossible to solve equations (1) under a condition in which $\omega_0$ changes randomly with time. According to the present invention, therefore, an approximation is made such that the magnetization vector M is in a steady state. To obtain a solution, equations (1) are rewritten by using a rotational coordinate system having a rotational speed of $\omega$. Mx and My which are the x- and y-components of the magnetization vector M in the fixed coordinate system have relations shown by equations (2) below with u and v which are the x- and y-components of M in the above-descrived rotational coordinate system.

[Expression 2]

$$M_x = u \cos \omega t - v \sin \omega t$$

$$M_y = -u \sin \omega t - v \cos \omega t \quad (2)$$

Equations (1) are rewritten by using the rotational coordinate system to obtain equations (3)

[Expression 3]

$$\frac{du}{dt} = -(\omega_0 - \omega)v - \frac{u}{T_2} \quad (3)$$

$$\frac{dv}{dt} = -\omega_1 M_z + (\omega_0 - \omega)u - \frac{v}{T_2}$$

$$\frac{dM_z}{dt} = \omega_1 v - \frac{M_z - M_0}{T_1}$$

If an approximation is made such that the magnetization vector M is in a steady state, each of the differential terms on the left side of equations (3) is zero. Equations (4) are the results of solving equations (3) under a condition $du/dt=dv/dt=dMz/dt=0$.

[Expression 4]

$$u = M_0 \frac{(\omega - \omega_0)\omega_1 T_2^2}{1 + (\omega - \omega_0)^2 T_2^2 + \omega_1^2 T_1 T_2} \quad (4)$$

$$v = M_0 \frac{-\omega_1 T_2}{1 + (\omega - \omega_0)^2 T_2^2 + \omega_1^2 T_1 T_2}$$

$$M_z = M_0 \frac{1 + (\omega - \omega_0)^2 T_2^2}{1 + (\omega - \omega_0)^2 T_2^2 + \omega_1^2 T_1 T_2}$$

Equations (2) and the law of electromagnetic induction are used to obtain an ideal detection signal $VD_0$ induced in the detection antenna placed in the x-axis direction, as shown below.

[Expression 5]

$$VD_0 = -\omega C \left[ u \sin(\omega t) + v \cos(\omega t) \right] \quad (5)$$
$$= \omega C A_0 \cos(\omega t + \phi)$$

In equation (5), C is a proportion constant determined by the characteristics of the detection coil, the positional relationship between the detection coil and the specimen and other factors, $A_0^2 = u^2 + v^2$, and $\text{Tan}(\phi) = -u/v$. In the actual detection signal VD, noise $\eta$ and a phase deviation $\phi$ in the circuit from the detection antenna to the lock detector are added to $VD_0$.

When the lock detector 20 performs detection, the phase of the reference signal VF is adjusted so that the phase deviation $\phi$ is cancelled out. In theory it is possible to completely cancel out the phase deviation $\phi$. In actuality, however, it is impossible to do so and a small phase error $\alpha$ is allowed to remain. Therefore, the dispersion signal SD and the absorption signal SA output from the lock detector 20 are accompanied by the phase error $\alpha$ and noise $\eta$ as shown in equation (7).

[Expression 6]

$$\begin{pmatrix} SD \\ SA \end{pmatrix} = \omega C' A_0 \begin{pmatrix} \sin(\phi + \alpha) \\ \cos(\phi + \alpha) \end{pmatrix} + \eta \begin{pmatrix} 1 \\ 1 \end{pmatrix} \quad (6)$$

In equation (6), C' is a value obtained by multiplying C in equation (5) by a change in signal amplitude due to the gain of the receiving circuit. To obtain the desired expression of the correction signal SC, equation (6) is rewritten into equation (7) shown below by substituting u and v in equation (6) and using a matrix.

[Expression 7]

$$\begin{pmatrix} SD \\ SA \end{pmatrix} = \omega C' M_0 \frac{\omega_1 T_2}{1 + (\omega - \omega_0)^2 T_2^2 + \omega_1^2 T_1 T_2} \quad (7)$$

$$\begin{pmatrix} \cos(\alpha) & \sin(\alpha) \\ -\sin(\alpha) & \cos(\alpha) \end{pmatrix} \begin{pmatrix} (\omega - \omega_0) T_2 \\ 1 \end{pmatrix} + \eta \begin{pmatrix} 1 \\ 1 \end{pmatrix}$$

$$= \omega C' M_0 \frac{\omega_1 T_2}{f(\omega_0)\sqrt{1 + (\omega - \omega_0)^2 T_2^2}} \begin{pmatrix} \cos(\alpha) & \sin(\alpha) \\ -\sin(\alpha) & \cos(\alpha) \end{pmatrix}$$

$$\begin{pmatrix} u_0(\omega_0) \\ v_0(\omega_0) \end{pmatrix} + \eta \begin{pmatrix} 1 \\ 1 \end{pmatrix},$$

$$f(\omega_0) = 1 + \frac{\omega_1^2 T_1 T_2}{1 + (\omega - \omega_0)^2 T_2^2},$$

$$u_0(\omega_0) = \frac{(\omega - \omega_0) T_2}{\sqrt{1 + (\omega - \omega_0)^2 T_2^2}}, \quad v_0(\omega_0) = \frac{1}{\sqrt{1 + (\omega - \omega_0)^2 T_2^2}}$$

Figure 5:
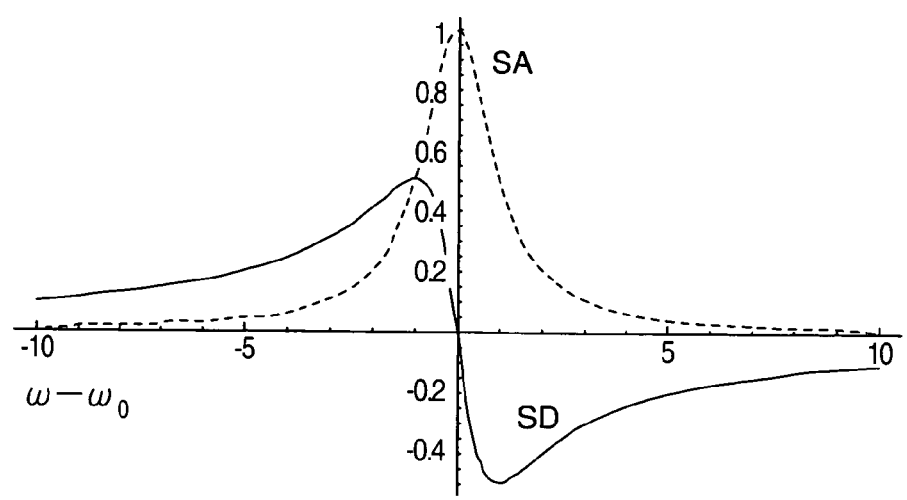
FIG. 5 is a graph showing an ideal dispersion signal SD and absorption signal SA for explanation of the present invention.
Figure 6:
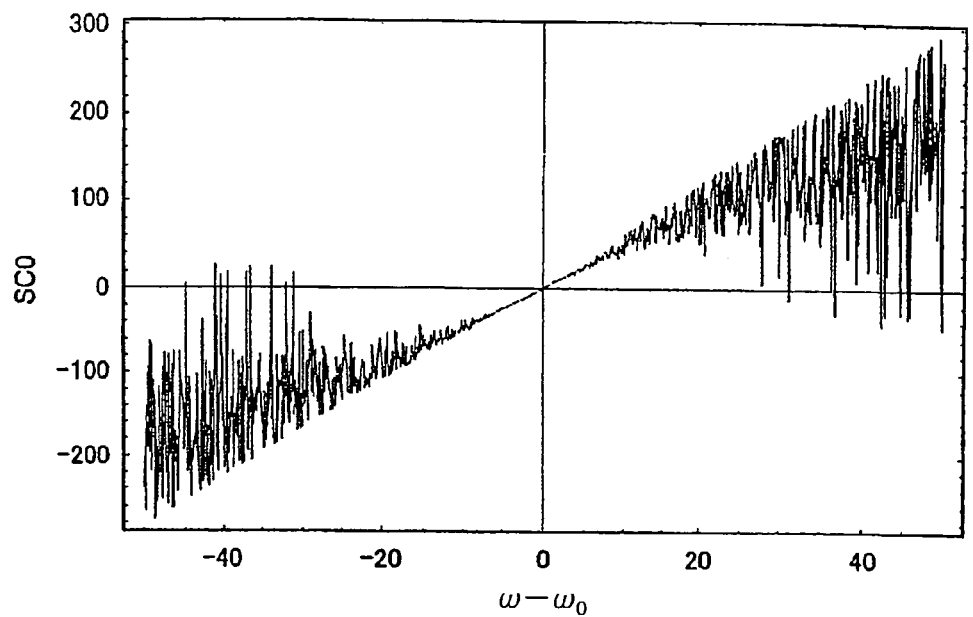
FIG. 6 is a graph of a correction signal obtained by using the present invention and setting G=1.

Equation (7) is considered under a condition $w_1^2 T_1 T_2 \ll 1$. Then $f(\omega_0) = 1$ in equation (7). The dependence of the dispersion signal SD and the absorption signal SA on $\omega_0$ is only $u_0(\omega_0)$ and $v_0(\omega_0)$. For example, if no phase error and no noise exist, $(\omega - \omega_0) = \omega C' M_0 \omega_1 \times SD/(SD^2 + SA^2)$ and it is possible to immediately achieve correction of the static magnetic field by equalizing the loop gain G to $1/(\omega C' M_0 \omega_1)$ and obtaining the correction signal SC by the method of the present invention. FIG. 5 is a graph showing the ideal dispersion signal SD and absorption signal SA. FIG. 6 shows an example of the correction signal SC according to the present invention. SC0 on the ordinate is the value of the correction signal SC when the loop gain G is 1.

Figure 7:
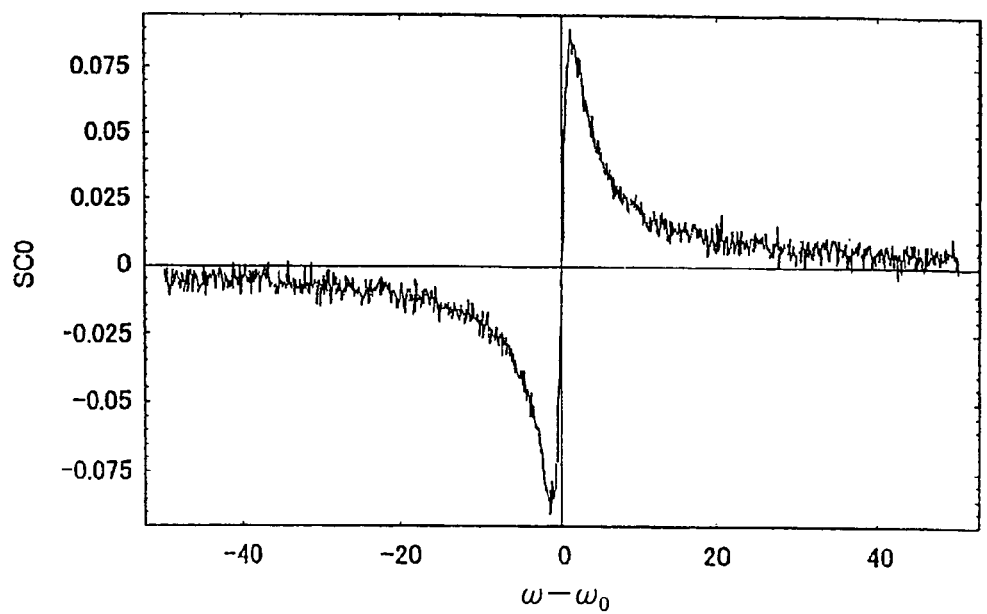
FIG. 7 is a graph of a correction signal obtained by using the technique disclosed in non-patent document 2 and setting G=1.
Figure 8:
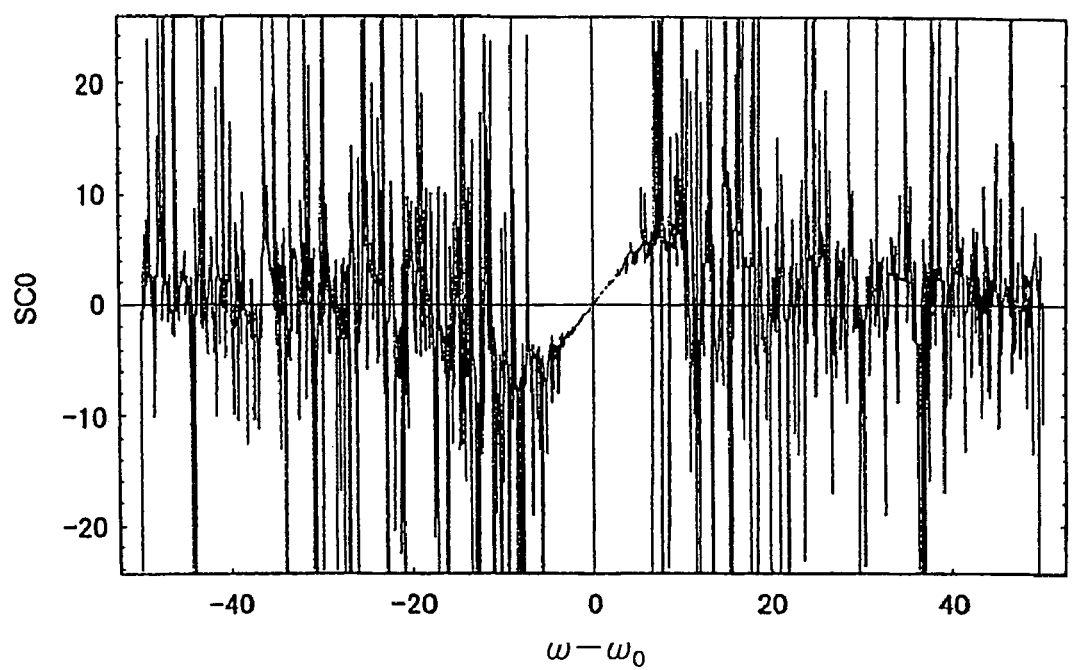
FIG. 8 is a graph of a correction signal obtained by using the technique disclosed in patent document 1 and setting G=1.

FIGS. 7 and 8 show the values of the correction signal SC0 obtained by using the techniques disclosed in non-patent document 2 and patent document 1. From comparison between FIG. 6 and FIGS. 7 and 8, it is apparent that the correction signal SC0 obtained by the present invention has improved monotonicity through a wide $\omega - \omega_0$ range. That is, according to the present invention, the correction signal SC changes linearly through a wide range.

When the phase error $\alpha$ is not zero, the correction signal SC obtained by the method of the present invention is as shown below.

[Expression 8]

$$SC = G \times SD/(SD^2 + SA^2) \quad (8)$$

$$= G \times \frac{1}{\omega_1 T_2} [\cos(\alpha) T_2(\omega - \omega_0) + \sin(\alpha)]$$

$$= G \times \cos(\alpha)(\omega - \omega_0)/\omega_1 + G \times \sin(\alpha)/(\omega_1 T_2)$$

$$\approx G \times (\omega - \omega_0)/\omega_1 + G \times \alpha/(\omega_1 T_2)$$

At the final line of equation (8), the correction signal SC is expressed by assuming that the phase error $\alpha$ is sufficiently small and by using Cosine and Sine to the primary term expanded by Taylor expansion with respect to the phase error $\alpha$. As shown by using equation (8), the method of computing the correction signal SC in accordance with the present invention ensures stable control even when the receiving phase error $\alpha$ is not zero.

[EMBODIMENT 2]

Figure 9:
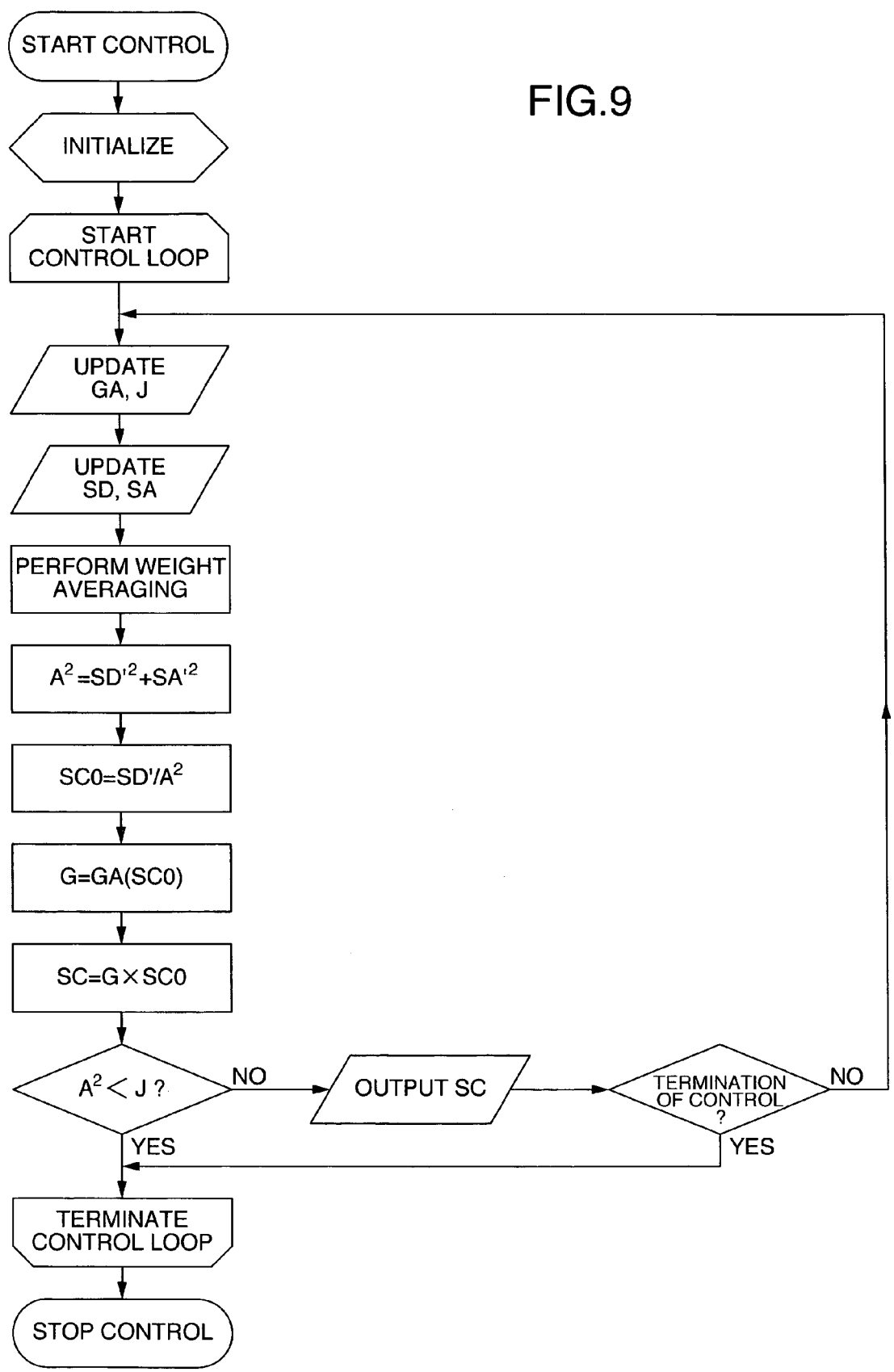
FIG. 9 is a flowchart showing the operation of a lock corrector in another embodiment of the present invention.

Another embodiment of the lock device of the present invention will be described with reference to the flowchart shown in FIG. 9. In the lock device having the configuration shown in FIGS. 1 and 2, the computation section 28 receives a control start instruction from the lock controller 27 and starts control, and starts the control loop after initializing the register in the computation section 28.

Subsequently, a table GA and a table J for the loop gain are updated on the basis of a value supplied from the lock controller 27. If there is no input supplied from the lock controller 27, default values for the table GA and the table J set at the time of register initialization are used for computation of the correction signal SC subsequently performed. The dispersion signal SD and the absorption signal SA are then updated to values supplied from the lock detector 20, and weight averaging is performed by using the values of the updated dispersion signal SD and absorption signal SA.

The order of weight averaging and weight coefficients are set by a user through the lock controller 27. The order may be set to 1 to make weight averaging ineffective. If the S/N of the lock signal is high, weight averaging may be made ineffective to improve the response of the lock device. When a weight-averaged dispersion signal SD' and a weight-averaged absorption signal SA' are obtained, $A^2 = SD'^2 + SA'^2$ and $SC0 = SD'/A^2$ are successively obtained. After obtaining SC0, a suitable loop gain value G is selected from the table GA for the loop gain according to the value of SC0.

The correspondence relationship between the loop gain G and the correction signal SC0 is, for example, $G = X - X/(SC0^2 + Y)$. X and Y are constants designated by the user. A suitable value may be selected as the loop gain G from GA according to a correspondence relationship such as that mentioned above, or the loop main G may be directly computed without using GA. After obtaining the loop gain G, the correction signal $SC = G \times SC0$ is obtained. Subsequently, $A^2$ is compared with the control range discrimination threshold value J. If $A^2$ is smaller than J, it is determined that a variation is out of the control range, and transition to control loop termination processing is made. If $A^2$ is equal to or larger than J, the correction signal SC is output to the lock power supply 24 through the corrector 30. Comparison between $A^2$ and J may be made at any stage between the step of obtaining $A^2$ and the step of outputting the correction signal SC.

Subsequently, a check is made as to whether or not a control termination instruction has been provided from the lock controller 27. The control termination instruction issued during control is stored by using, for example, a queue memory so as not to be lost during control and is executed after output of the correction signal SC. If the control termination instruction has not been provided, the process returns to the initial point in the control loop to repeat the control loop. If the control termination instruction has been provided, transition to loop termination processing is made and control is terminated when the termination processing is completed. If the method of computing the correction signal SC in this embodiment is used, the correction signal SC can be obtained with high accuracy regardless of the condition $w_1^2 T_1 T_2 \ll 1$.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A stabilizer for an NMR magnetic field, comprising:

a lock transmitter which generates a high-frequency wave and radiates the high-frequency wave to a specimen placed at a probe;

a lock receiver which receives a detection signal from the specimen;

a lock detector which performs complex detection of the detection signal and outputs an absorption signal SA which is a real number component of the detection signal and a dispersion signal SD which is an imaginary number component of the detection signal;

a lock corrector;

a lock power supply; and a lock coil, wherein the lock corrector is supplied with the dispersion signal SD and the absorption signal SA, outputs a correction signal SC obtained by multiplying together $SD/(SD^2 + SA^2)$ and a predetermined constant G, and controls the lock power supply according to the correction signal SC to correct a current in the lock coil.

2. The stabilizer according to claim 1, wherein the lock power supply performs adjustment so that a current proportional to the correction signal SC flows through the lock coil.

3. The stabilizer according to claim 1, wherein different constants G are selectively used according to the value of $SD/(SD^2 + SA^2)$.

4. The stabilizer according to claim 1, wherein the lock power supply performs adjustment so that a current proportional to the correction signal SC flows through the lock coil, and wherein different constants G are selectively used according to the value of $SD/(SD^2 + SA^2)$.

5. The stabilizer according to claim 1, wherein the lock corrector outputs the correction signal SC changing monotonously and linearly with respect to a change in the NMR magnetic field.

6. A stabilizer for stabilizing an NMR magnetic field, the stabilizer correcting a disturbance in the intensity of a static magnetic field, the stabilizer comprising:

a lock transmitter which generates a high-frequency wave and radiates the high-frequency wave to a specimen placed at a probe;

a lock receiver which receives a detection signal from the specimen;

a lock detector which forms a dispersion signal and an absorption signal by multiplying together the received signal and a reference signal having a predetermined frequency, phase and amplitude;

a lock corrector which obtains a correction signal SC by multiplying together a predetermined constant G and $SD/(SD^2 + SA^2)$ obtained from an absorption signal SA which is a real number component of the signal from the lock detector and a dispersion signal SD which is an imaginary number component of the signal from the lock detector; and a lock power supply which causes a current proportional to the correction signal SC from the lock corrector to flow through a lock coil provided around the specimen.

7. A method of stabilizing an NMR magnetic field, the method comprising:

performing complex detection of a voltage signal induced in a detection antenna by a motion of a nucleus spin in a specimen caused by an alternating-current magnetic field radiated from a lock transmitter;

obtaining a correction signal SC by multiplying together a predetermined constant G and $SD/(SD^2+SA^2)$ obtained from an absorption signal SA which is a real number component of the detected voltage signal and a dispersion signal SD which is an imaginary number component of the detected voltage signal; and correcting a disturbance in the intensity of a static magnetic field.

8. The method according to claim 7, wherein different constants G are selectively used according to the value of $SD/(SD^2+SA^2)$.

* * * * *